US009793452B2

(12) United States Patent
Sun et al.

(10) Patent No.: US 9,793,452 B2
(45) Date of Patent: Oct. 17, 2017

(54) BLUE LIGHT LEAKAGE-SUPPRESSING LED STRUCTURE

(71) Applicant: National Central University, Taoyuan (TW)

(72) Inventors: Ching-Cherng Sun, Taoyuan (TW); Tsung-Hsun Yang, Taoyuan (TW); Te-Yuan Chung, Taoyuan (TW); Yu-Yu Chang, Taoyuan (TW); Shang-Fu Yang, Taoyuan (TW)

(73) Assignee: National Central University, Taoyuan (TW)

( * ) Notice: Subject to any disclaimer, the term of this patent is extended or adjusted under 35 U.S.C. 154(b) by 0 days.

(21) Appl. No.: 14/735,281

(22) Filed: Jun. 10, 2015

(65) Prior Publication Data

US 2016/0308096 A1    Oct. 20, 2016

(30) Foreign Application Priority Data

Apr. 20, 2015  (TW) .............................. 104112608 A

(51) Int. Cl.
*H01L 33/50* (2010.01)
*H01L 33/54* (2010.01)
(Continued)

(52) U.S. Cl.
CPC .............. *H01L 33/56* (2013.01); *H01L 33/44* (2013.01); *H01L 33/50* (2013.01); *H01L 33/54* (2013.01)

(58) Field of Classification Search
CPC ..... H01L 33/502; H01L 33/54; H01L 33/641; H01L 33/50; H01L 33/52; H01L 33/56;
(Continued)

(56) References Cited

U.S. PATENT DOCUMENTS 4,661,605 A * 4/1987 Schmidt ................. B41M 5/145
548/463
2006/0102914 A1 * 5/2006 Smits ...................... H01L 33/54
257/98
(Continued)

FOREIGN PATENT DOCUMENTS

CN       204164937      * 2/2015   ............... F21S 10/02
DE       102012205461   * 10/2016  ............... C09K 9/02

*Primary Examiner* — Galina Yushina
(74) *Attorney, Agent, or Firm* — Juan Carlos A. Marquez; Marquez IP Law Office, PLLC

(57) ABSTRACT

A blue light leakage-suppressing LED structure for emitting white light includes at least one LED chip, an encapsulation element, a light output lens, and an optical fuse coating formed of a thermosensitive material; or includes at least one LED chip and an encapsulation element formed of a mixture of an encapsulation material and a thermosensitive material; or includes at least one blue LED chip, a fluorescent powder layer, an isolation region, an optical fuse layer, and a light output lens. Thanks to the hue changing property of the thermosensitive material, the LED structure can reduce the intensity of its short-wavelength light component and its overall brightness significantly before reaching the L70 threshold, after passing which the LED structure will emit excessive blue light. Thus, the user is protected from overexposure to blue light and will be reminded to replace the LED structure when the LED structure is about to malfunction.

3 Claims, 9 Drawing Sheets

(51) Int. Cl.
*H01L 33/56* (2010.01)
*H01L 33/44* (2010.01)

(58) Field of Classification Search
CPC ......... H01L 33/58; H01L 33/00; H01L 33/44; H01L 27/14625; H01L 27/14627; H01L 27/142; H01L 33/552
See application file for complete search history.

(56) References Cited

U.S. PATENT DOCUMENTS

| | | | |
|---|---|---|---|
| 2011/0215283 A1* | 9/2011 | Morimitsu | C08G 63/685 252/586 |
| 2011/0281104 A1* | 11/2011 | Iftime | B41M 7/0036 428/327 |
| 2014/0072013 A1* | 3/2014 | Ruknudeen | G01K 7/01 374/178 |

* cited by examiner

BLUE LIGHT LEAKAGE-SUPPRESSING LED STRUCTURE

BACKGROUND OF THE INVENTION

1. Technical Field

The present invention relates to a white light-emitting diode (LED) structure and, more particularly, to a blue light leakage-suppressing LED structure in which a thermochromics material can change its hue as the temperature of the LED is changed.

2. Description of Related Art

Driven by the rising awareness of environmental protection and the expectation of sustainable development, energy-saving light sources are now in extensive use. In particular, the demand for LEDs, which feature very low power consumption and adequate brightness, has increased the most.

The estimated service lives of LEDs are generally specified with an L70 value, which indicates the time for which the luminous flux of an LED is expected to last before dropping to 70% of that which has been achieved under a thermally stable condition. Once an LED reaches the L70 threshold, its temperature (or more particularly the junction temperature inside the LED) will be approximately equal to or higher than 150° C., and the correlated color temperature (CCT) of the LED at this moment will be about 9000 K or above.

However, during the period in which a white LED is about to reach but has not reached the L70 threshold, the light emission efficiency of the white LED is already lowered by the heat generated, and the lowered light emission efficiency results in more. heat. Eventually, the absorption efficiency of the fluorescent material in the white LED will be reduced, leading to a significant leakage of blue light.

More and more researches spurred by the increasing popularity of LEDs have shown that blue light is highly detrimental to the structure of the human eye. The eyes may be injured beyond repair if exposed to blue light for an extended period of time.

In view of this, and in order to bring about substantial improvement in people's quality of life, the LED industry, if not the entire lighting industry, has made great efforts in developing a simple yet effective technology or LED structure that enables a portion of a white LED to effect a change in hue before the white LED generates a large amount of heat and emits excessive blue light. The change in hue is intended to prevent unnecessary injury otherwise attributable to a significant leakage of blue light and, by reducing the brightness of the white LED considerably, to remind the user that the light source needs to be replaced.

BRIEF SUMMARY OF THE INVENTION

The present invention relates to a blue light leakage-suppressing LED structure which emits white light and which includes at least one LED chip, an encapsulation element, a light output lens, and an optical fuse coating formed of a thermosensitive material. The present invention also relates to a blue light leakage-suppressing LED structure which emits white light and which includes at least one LED chip and an encapsulation element formed of a mixture of an encapsulation material and a thermochromics material. According to the present invention, the hue changing property of the thermochromics material enables the LED structure to be substantially reduced in brightness before the LED chip reaches the L70 threshold, after passing which the LED chip will emit a large amount of blue light. Thus, the user is kept from overexposure to blue light and will be reminded to replace the LED structure when the LED structure is about to malfunction.

The present invention provides a blue light leakage-suppressing LED structure which emits white light and which includes: at least one LED chip; an encapsulation element covering the LED chip in a sealing manner; a light output lens covering a light output surface of the encapsulation element; and an optical fuse coating formed of a thermosensitive material and applied to an outer surface of the light output lens.

The present invention also provides a blue light leakage-suppressing LED structure which emits white light and which includes at least one LED chip and an encapsulation element covering the LED chip in a sealing manner, wherein the encapsulation element is formed of an encapsulation material mixed with a thermochromics material.

The present invention further provides a blue light leakage-suppressing LED structure which emits white light and which includes: at least one blue LED chip electrically connected to and fixedly provided on a substrate; a fluorescent powder layer provided on a light output surface of the blue LED chip; an isolation region surrounding and covering the blue LED chip and the fluorescent powder layer on the substrate; an optical fuse layer formed of a mixture of a thermochromics material and silicone and covering the isolation region, the blue LED chip, and the fluorescent powder layer in a sealing manner; and a light output lens covering an outer portion of the optical fuse layer.

Implementation of the present invention at least involves the following inventive steps:

1. No complicated manufacturing process is required, and only a low implementation cost is incurred.

2. The utilization rate of white LEDs will hopefully be increased to promote the practice of energy saving and the use of green energy.

3. Excessive blue light irradiation is prevented to effectively protect human eyes.

4. A user will be explicitly reminded to replace the light source of illumination.

The features and advantages of the present invention are detailed hereinafter with reference to the preferred embodiments. The detailed description is intended to enable a person skilled in the art to gain insight into the technical contents disclosed herein and implement the present invention accordingly. In particular, a person skilled in the art can easily understand the objects and advantages of the present invention by referring to the disclosure of the specification, the claims, and the accompanying drawings.

BRIEF DESCRIPTION OF THE SEVERAL VIEWS OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE INVENTION

Figure 1:
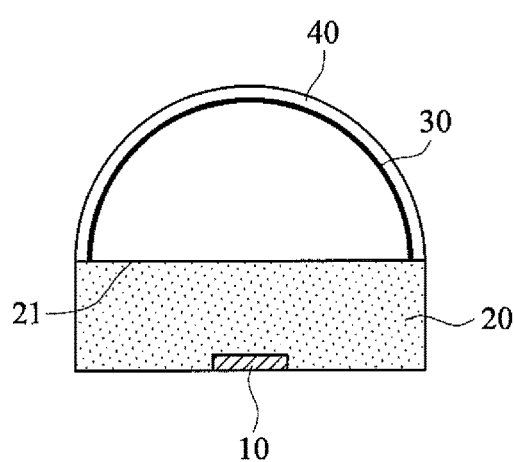
FIG. 1 schematically shows the blue light leakage-suppressing LED structure in an embodiment of the present invention.

Referring to FIG. 1, the blue light leakage-suppressing LED structure 100 in an embodiment of the present invention is configured to emit white light and includes at least one LED chip 10, an encapsulation element 20, a light output lens 30, and an optical fuse coating 40.

As shown in FIG. 1, the LED chip 10 in the LED structure 100 is a light source for emitting light. The LED chip 10 may include at least one blue LED chip which emits light of wavelengths ranging from 400 to 480 nm.

The encapsulation element 20 in FIG. 1 covers the LED chip 10 in a sealing manner. The constituent materials of the encapsulation element 20 may include a fluorescent material so that the blue light emitted by a blue LED chip can react with the fluorescent material, thereby enabling the LED structure 100 to emit white light.

The encapsulation element 20 can be formed of silicone, epoxy, or a like material featuring both light permeability and a sealing property.

Figure 3:
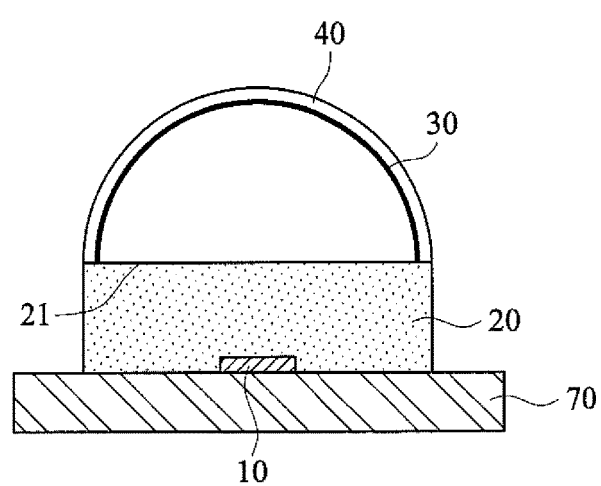
FIG. 3 schematically shows the blue light leakage-suppressing LED structure in FIG. 1 further including at least one heat dissipation element.

Referring to FIG. 3, if the LED structure 100 requires more efficient heat dissipation, the encapsulation element 20 can be fixedly attached to a heat dissipation element 70 which enhances heat dissipation from the encapsulation element 20 and hence from the entire LED structure 100.

The fluorescent material may be yttrium-aluminum garnet (YAG)-based fluorescent powder, silicate-based fluorescent powder, nitride-based fluorescent powder, quantum dot-based fluorescent powder, or a mixture of at least two of the foregoing.

If no fluorescent material is used, a plurality of LED chips 10 configured respectively for emitting light of different colors (e.g., blue and yellow; or blue, red, and green) can be used at the same time so that the differently colored light is mixed to produce white light. The production of white light can be achieved by various conventional techniques, which are not dealt with herein.

Referring back to FIG. 1, the light output lens 30 covers a light output surface 21 of the encapsulation element 20. The light output lens 30 may be a common lens that allows passage of light or a lens with special optical effects such as a Fresnel lens or a Gauss lens.

With continued reference to FIG. 1, the optical fuse coating 40 is formed of a thermochromics material 60 and is applied to the outer surface of the light output lens 30. In other words, the white light emitted by the LED structure 100 passes through the optical fuse coating 40 before leaving the LED structure 100.

The thermochromics material 60 can be formed of cellulose, thermochromic paint, a thermochromic ink, a thermochromic pigment, polyvinylpyrrolidone (PVP), or a mixture of at least two of the foregoing.

Referring again to FIG. 1, the thermosensitive material 60 can be so chosen that it is colorless and transparent or is white when the LED structure 100 is in normal operation, or more particularly when the light emitted by the LED structure 100 has a correlated color temperature lower than 9000 K and the corresponding temperature of the LED chip 10 is lower than about 150° C., wherein the temperature of about 150° C. corresponds to the L70 threshold.

Figure 7:
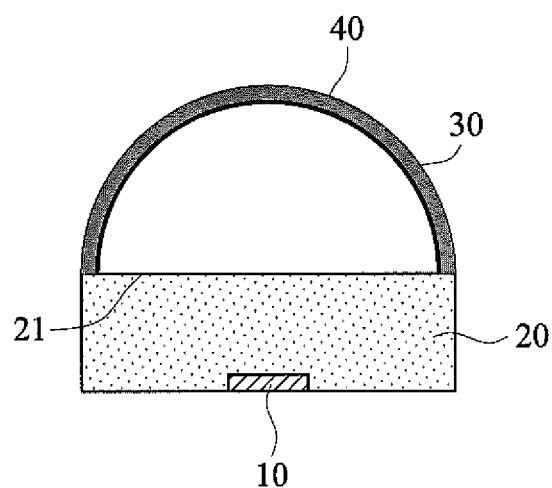
FIG. 7 schematically shows how the thermochromics material in the blue light leakage-suppressing LED structure in an embodiment of the present invention changes its hue when the temperature of the LED corresponds to a correlated color temperature of 9000 K or above.

On the other hand, referring to FIG. 7, when the LED structure 100 begins to show signs of abnormality such that the correlated color temperature of the light it emits approaches or becomes higher than 9000 K, with the corresponding temperature of the LED chip 10 approaching or having reached about 150° C. (i.e., the L70 threshold) or above, the thermosensitive material 60 changes its hue to one which is neither colorless and transparent nor white (e.g., black, red, or yellow).

It is worth mentioning that, when the correlated color temperature of the light emitted by the LED structure 100 is 9000 K or above, the corresponding temperature of the LED chip 10 in the LED structure 100 varies from one LED chip to another but generally ranges between 150° C. and 200° C.

Thus, when the LED chip 10 in the LED structure 100 has reached or is about to reach the L70 threshold and hence generates a huge amount of heat such that the correlated color temperature of the light emitted by the LED structure 100 is close to or even above 9000 K, the thermochromics material 60 turns from colorless and transparent or white to a hue which is neither colorless and transparent nor white (e.g., black, red, or yellow); in other words, the hue of the entire optical fuse coating 40 is changed to one which is neither colorless and transparent nor white, and which therefore substantially reduces the passage of light, including blue light. The change in hue not only eliminates the risk of eye injuries attributable to overexposure to blue light, but also reminds the user to replace the light source, which is damaged already or has shown signs of damage.

Figure 2A:
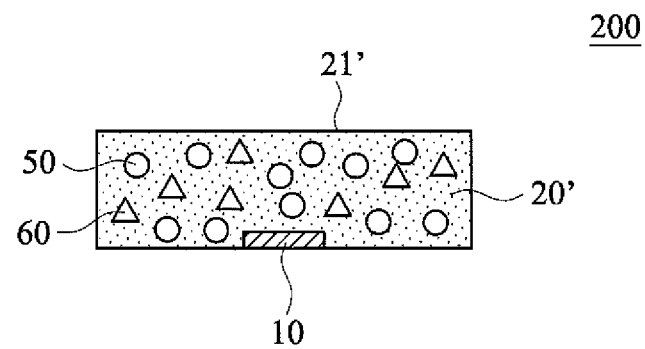
FIG. 2A schematically shows the blue light leakage-suppressing LED structure in another embodiment of the present invention.

FIG. 2A shows the blue light leakage-suppressing LED structure 200 in another embodiment of the present invention, wherein the LED structure 200 is configured to emit white light and includes at least one LED chip 10 and an encapsulation element 20'.

The LED chip 10 in FIG. 2A is a light source for emitting light and may include at least one blue LED chip configured to emit light whose wavelength ranges from 400 to 480 nm.

The encapsulation element 20' in FIG. 2A covers the LED chip 10 in a sealing manner and is formed of an encapsulation material mixed with a fluorescent material 50 and a thermochromics material 60. The encapsulation material of the encapsulation element 20' may be formed of silicone or epoxy.

The thermosensitive material 60 may be cellulose, a thermochromic paint, a thermochromic ink, a thermochromic pigment, PVP, or a mixture of at least two of the foregoing.

Figure 2B:
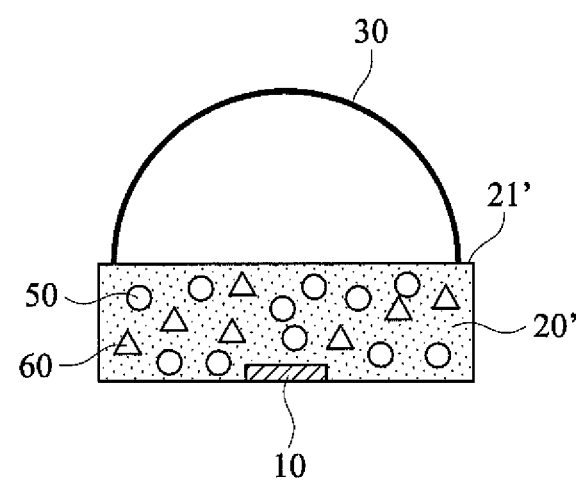
FIG. 2B schematically shows the blue light leakage-suppressing LED structure in FIG. 2A further including a light output lens.

As shown in FIG. 2B, the LED structure 200 may further include a light output lens 30 which covers a light output surface 21' of the encapsulation element 20'. It is understood that, like its counterpart in the previous embodiment, the light output lens 30 may be a common lens that allows passage of light or a lens with special optical effects such as a Fresnel lens or a Gauss lens.

Figure 4A:
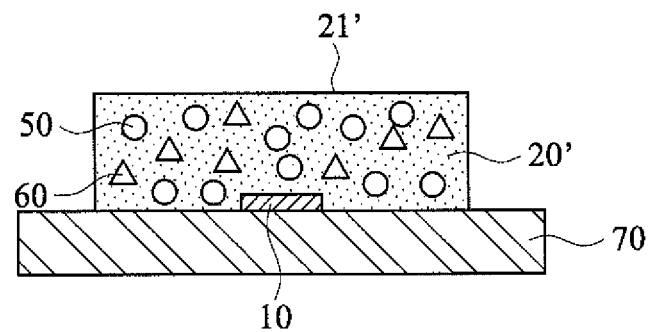
FIG. 4A schematically shows the blue light leakage-suppressing LED structure in FIG. 2A further including at least one heat dissipation element.
Figure 4B:
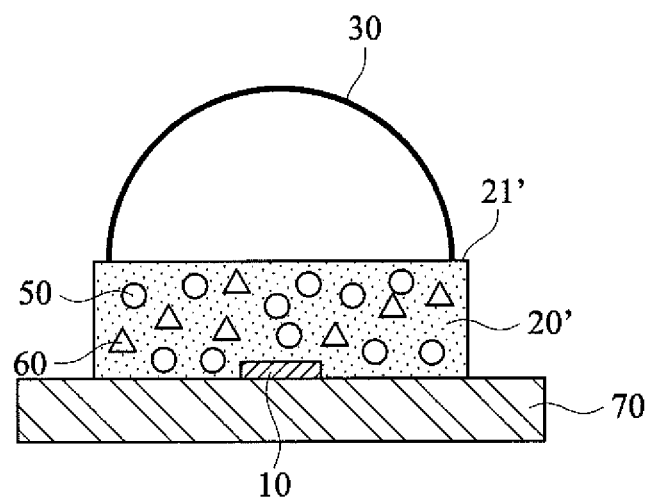
FIG. 4B schematically shows the blue light leakage-suppressing LED structure in FIG. 2B further including at least one heat dissipation element.

Moreover, referring to FIG. 4A and FIG. 4B, the encapsulation element 20' can be fixedly attached to a heat dissipation element 70 to enhance heat dissipation from the LED structure 200, regardless of whether the light output lens 30 is present or not. The heat dissipation element 70 serves to increase the efficiency of heat dissipation from the encapsulation element 20' and hence from the entire LED structure 200.

Referring now to FIG. 2A, FIG. 2B, FIG. 4A, and FIG. 4B, when the LED structure 200 is operating in a normal condition, in which the correlated color temperature of the light emitted is lower than 9000 K and the corresponding temperature of the LED chip 10 is lower than about 150° C., which is typical of the L70 threshold, the thermosensitive material 60 is colorless and transparent or is white.

Figure 8A:
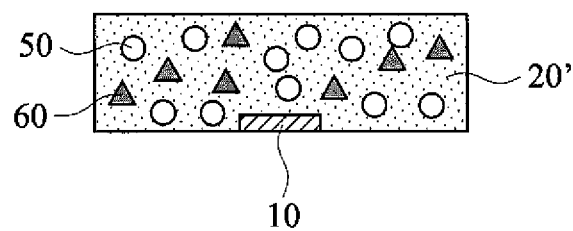
FIG. 8A schematically shows how the thermosensitive material in the blue light leakage-suppressing LED structure in another embodiment of the present invention changes its hue when the temperature of the LED corresponds to a correlated color temperature of 9000 K or above.
Figure 8B:
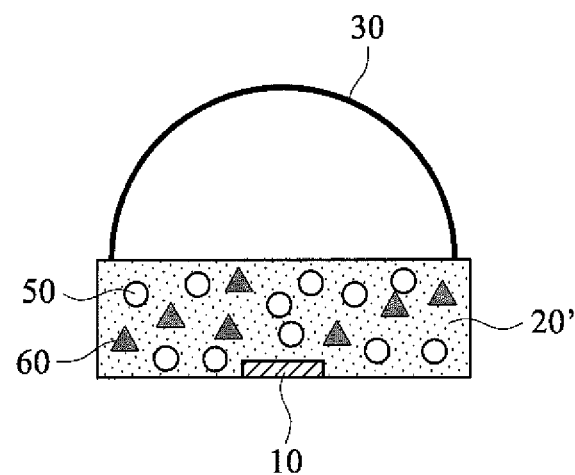
FIG. 8B schematically shows how the thermosensitive material in the blue light leakage-suppressing LED structure in yet another embodiment of the present invention changes its hue when the temperature of the LED corresponds to a correlated color temperature of 9000 K or above.

However, referring to FIG. 8A and FIG. 8B, when the LED structure 200 starts to operate in an abnormal condition such that the correlated color temperature of the light emitted approaches or exceeds 9000 K and the corresponding temperature of the LED chip 10 is about to reach or has reached the L70 threshold (i.e., being about 150° C. or above), the thermochromics material 60 changes from colorless and transparent or white to a hue which is neither colorless and transparent nor white (e.g., black, red, or yellow). As a result, light (including blue light) that can pass through the encapsulation element 20' is substantially reduced.

This significant reduction in light permeability not only protects the user from overexposure to blue light and consequently from associated eye injuries, but also serves to remind the user in an unambiguous manner that the light source of illumination is damaged or has shown signs of damage and needs replacing.

The interaction between the LED chip 10 and the thermochromics material 60 while the LED chip 10 passes the L70 threshold is further illustrated with reference to FIG. 5 and FIG. 6, which respectively plot the correlated color temperatures and luminous fluxes of an LED structure without the thermochromics material 60 and an LED structure of the present invention (i.e., with the thermosensitive material 60) against time.

Figure 5:
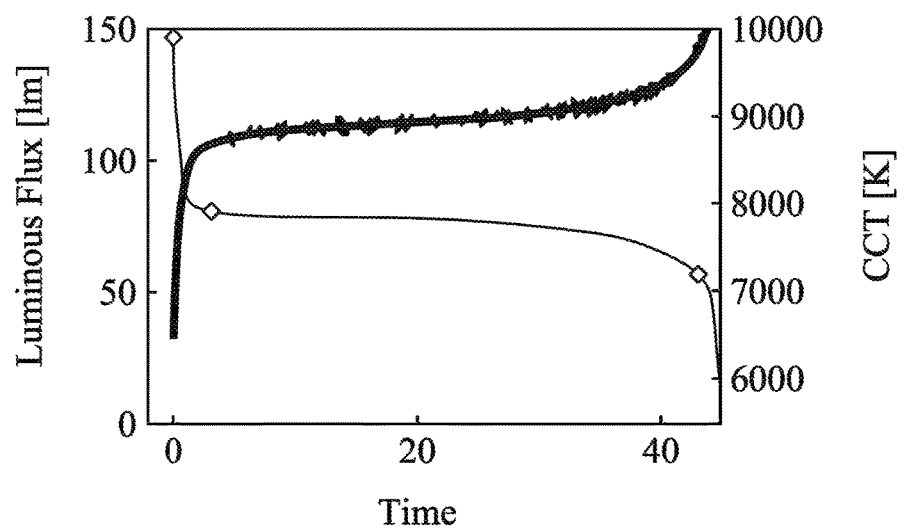
FIG. 5 plots the characteristic curves of an LED structure without a thermochromics material whose hue changes with the correlated color temperature of the LED chip.

As shown in FIG. 5, a common white LED (without the thermochromics material 60) having reached the L70 threshold (i.e., with a correlated color temperature of 9000 K) or about to reach the L70 threshold (i.e., with a correlated color temperature approaching 9000 K) generates and releases a considerable amount of heat such that a significant leakage of blue light occurs. In consequence, the correlated color temperature (represented by the thicker black line in FIG. 5) rises precipitously.

Figure 6:
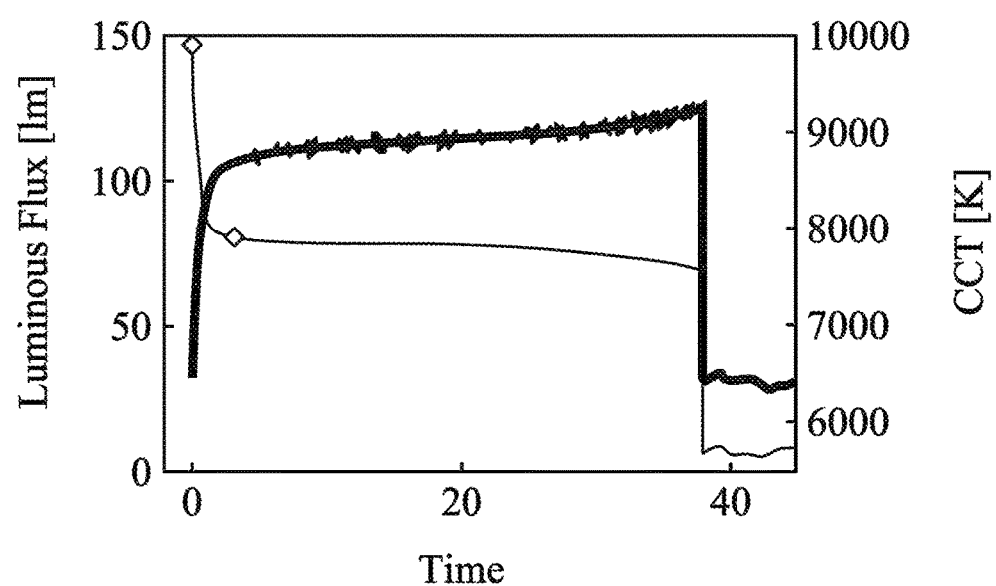
FIG. 6 plots the characteristic curves of the blue light leakage-suppressing LED structure in an embodiment of the present invention, showing how the thermochromics material changes its hue in response to a change in the correlated color temperature of the LED chip.

However, referring to FIG. 6, when the thermochromics material 60 is incorporated into the encapsulation element 20', the large amount of blue light generated immediately before the L70 threshold is reached is blocked by the thermochromics material 60, which by that time has turned into a non-colorless, non-transparent, and non-white hue such as black, red, or yellow. As a result, the correlated color temperature plummets (as shown by the thicker black line in FIG. 6), which dims the light rapidly and thereby notifies the user that this light source needs replacing.

Figure 9:
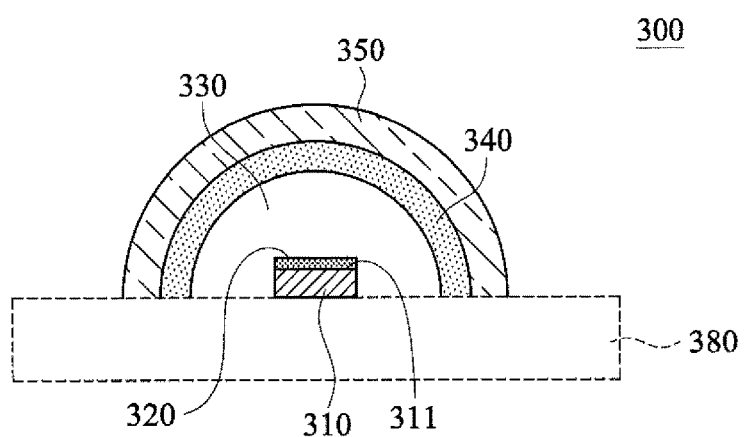
FIG. 9 schematically shows the blue light leakage-suppressing LED structure in still another embodiment of the present invention.

FIG. 9 shows the blue light leakage-suppressing LED structure 300 in yet another embodiment of the present invention, wherein the LED structure 300 is configured to emit white light and includes at least one blue LED chip 310, a fluorescent powder layer 320, an isolation region 330, an optical fuse layer 340, and a light output lens 350.

The blue LED chip 310 in FIG. 9 is configured to emit blue light and is electrically connected to and fixedly provided on a substrate 380.

As shown in FIG. 9, the fluorescent powder layer 320 is provided on a light output surface 311 of the blue LED chip 310. The blue light emitted by the blue LED chip 310 reacts with the fluorescent powder layer 320 to produce white light.

The isolation region 330 in FIG. 9 surrounds and covers the blue LED chip 310 and the fluorescent powder layer 320 on the substrate 380. The isolation region 330 can be a space filled with nothing but air or be filled with silicone, epoxy, or both silicone and epoxy.

The optical fuse layer 340 in FIG. 9 is formed of a mixture of a thermochromics material 60 and silicone and covers the isolation regions 330, the blue LED chip 310, and the fluorescent powder layer 320 in a sealing manner.

Like its counterparts in the LED structures 100 and 200, the thermochromics material 60 used in the LED structure 300 may be cellulose, a thermochromic paint, a thermochromic ink, a thermochromic pigment, PVP, or a mixture of at least two of the foregoing.

Furthermore, the thermochromics material 60 is colorless and transparent or is white when at a temperature lower than 150° C. and turns into a hue which is neither colorless and transparent nor white when at a temperature not lower than 150° C.

The large amount of blue light generated in the LED structure 300 immediately before or after the L70 threshold is reached will turn the thermochromics material 60 into a hue which is neither colorless and transparent nor white (e.g., black, red, or yellow), in order for the thermochromics material 60 to block the passage of light and reduce the luminous flux of the LED structure 300 significantly. The correlated color temperature of the LED structure 300 will drop as a result, and the light will dim accordingly, which serves to notify the user that the light source needs to be replaced.

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. A blue light leakage-suppressing light-emitting diode (LED) structure for emitting white light, comprising:
   at least one blue LED chip electrically connected to and fixedly provided on a substrate;

a fluorescent powder layer provided on a light output surface of the blue LED chip;

an optical fuse layer formed of a mixture of a thermochromics material and silicone and covering an isolation region, the blue LED chip, and the fluorescent powder layer; the isolation region being formed between the optical fuse layer and the fluorescent powder layer to prevent the optical fuse layer from touching the fluorescent powder layer; and a light output lens covering an outer portion of the optical fuse layer;

wherein the thermochromics material is colorless and transparent when at a temperature lower than 150° C. and turns into a hue which is neither colorless nor transparent when at a temperature not lower than 150° C.

2. The LED structure of claim 1, wherein the isolation region is filled with silicone, epoxy, or air.

3. The LED structure of claim 1, wherein the thermochromics material is formed of cellulose, a thermochromic paint, a thermochromic ink, a thermochromic pigment, polyvinylpyrrolidone (PVP), or a mixture of at least two thereof.

* * * * *